United States Patent
Chen et al.

(10) Patent No.: US 7,247,571 B2
(45) Date of Patent: Jul. 24, 2007

(54) METHOD FOR PLANARIZING SEMICONDUCTOR STRUCTURES

(75) Inventors: Ying-Tsung Chen, Chiayi (TW);
Yung-Cheng Lu, Taipei (TW);
Zhen-Cheng Wu, Hsinchu soo (TW);
Pi-Tsung Chen, Jiangjyun Township, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/226,979

(22) Filed: Sep. 15, 2005

(65) Prior Publication Data
US 2007/0054494 A1 Mar. 8, 2007

(51) Int. Cl.
*H01L 21/311* (2006.01)
(52) U.S. Cl. ............... 438/700; 438/692; 438/690; 438/689; 257/E21.206; 257/E21.243
(58) Field of Classification Search ........... 438/690, 438/689, 692, 700
See application file for complete search history.

(56) References Cited

U.S. PATENT DOCUMENTS

| | | | |
|---|---|---|---|
| 5,923,993 A * | 7/1999 | Sahota | 438/427 |
| 6,380,078 B1 * | 4/2002 | Liu et al. | 438/638 |
| 6,391,792 B1 * | 5/2002 | Jang et al. | 438/734 |
| 6,521,523 B2 * | 2/2003 | Lee et al. | 438/633 |
| 2003/0228734 A1 * | 12/2003 | Natsume et al. | 438/253 |
| 2006/0043590 A1 * | 3/2006 | Chen et al. | 257/752 |

* cited by examiner

Primary Examiner—Chandra Chaudhari
Assistant Examiner—Victor V. Yevsikov
(74) Attorney, Agent, or Firm—Kirkpatrick & Lockhart Preston Gates Ellis

(57) ABSTRACT

A method for planarizing a semiconductor structure is disclosed. A semiconductor substrate having a first area in which one or more trenches are formed in a first pattern density, and a second area in which one or more trenches are formed in a second pattern density lower than the first pattern density, is provided. A first dielectric layer is formed above the semiconductor for covering the trenches in the first and second areas. A first chemical mechanical polishing is performed on the first dielectric layer using a predetermined type of slurry for reducing a thickness thereof. The first dielectric layer is then rinsed. A second chemical mechanical polishing is performed on the first dielectric layer using the predetermined type of slurry for further removing the first dielectric layer outside the trenches, thereby reducing a step height variation between surfaces of the first and second areas.

21 Claims, 4 Drawing Sheets

METHOD FOR PLANARIZING SEMICONDUCTOR STRUCTURES

BACKGROUND

The present invention relates generally to semiconductor processing technology, and more particularly to a method for planarizing semiconductor structures.

A chemical mechanical polishing (CMP) process is a semiconductor processing technology that is used for planarizing a surface of a semiconductor structure. Various types of high selectivity slurry (HSS) are often applied during the CMP process for providing a higher polish rate for one material than another. For example, the HSS is often used in the CMP process during the formation of shallow trench isolation (STI) structures. Conventionally, the STI structures are constructed by performing a series of process steps. A silicon nitride layer having a plurality of openings is deposited on a semiconductor substrate. An etching step is performed, using the silicon nitride layer as a mask, to form a plurality of trenches through the openings in the semiconductor substrate. A silicon oxide layer is deposited in the trenches and on the silicon nitride layer. The CMP process is then performed, using HSS for providing the silicon oxide layer with a higher polish rate than that of the silicon nitride layer.

Conventionally, the CMP using HSS is performed in a continuous process without interruption. While the continuous process of applying HSS can remove most of the silicon oxide layer, the polish rate of HSS will slow down over time, especially in an area of the semiconductor substrate where the pattern density of the trenches is high. This may cause an undesired step height variation across the high pattern density area and the low pattern density area. Thus, divots may be formed on the semiconductor substrate.

It is desirable to have a planarization method for providing a semiconductor structure with a reduced step height variation across the high pattern density area and the low pattern density area.

SUMMARY

The present invention discloses a method for planarizing a semiconductor structure. In one embodiment of the invention, a semiconductor substrate having a first area in which one or more trenches are formed in a first pattern density, and a second area in which one or more trenches are formed in a second pattern density lower than the first pattern density, is provided. A first dielectric layer is formed above the semiconductor for covering the trenches in the first and second areas. A first chemical mechanical polishing is performed on the first dielectric layer using a predetermined type of slurry for reducing a thickness thereof. The first dielectric layer is then rinsed. A second chemical mechanical polishing is performed on the first dielectric layer using the predetermined type of slurry for further removing the first dielectric layer outside the trenches, thereby reducing a step height variation between surfaces of the first and second areas.

The construction and method of operation of the invention, however, together with additional objects and advantages thereof will be best understood from the following description of specific embodiments when read in connection with the accompanying drawings.

DESCRIPTION

FIGS. 1A through 1F illustrate a number of cross-sectional views of a semiconductor structure after being processed in various steps of a proposed planarization method in accordance with one embodiment of the present invention. The proposed planarization method is explained in the context of forming STI structures on a semiconductor substrate. It is, however, understood that the proposed method can be used to planarize any surface of semiconductor structures other than the STI.

Figure 1A:
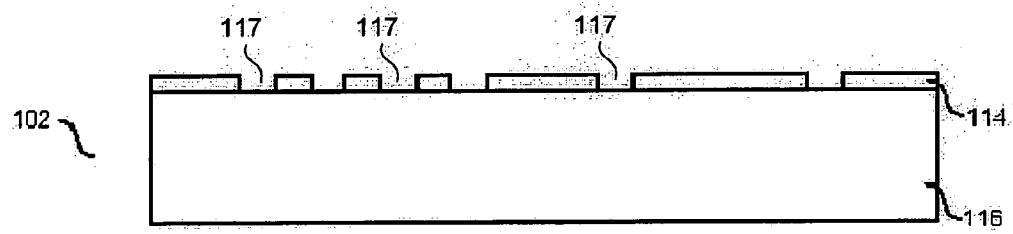
FIGS. 1A through 1F illustrate a number of cross-sectional views of a semiconductor structure after being processed in various steps of a proposed planarization method in accordance with one embodiment of the present invention.

FIG. 1A illustrates a cross-sectional view 102 of a semiconductor structure, which includes a first dielectric layer 114 deposited on a semiconductor substrate 116. The first dielectric layer 114, to be alternatively seen as a blocking layer, is patterned by lithography technology where a set of openings 117 provides the placement locations of the STI structures to be formed. In this embodiment, the first dielectric layer 114 is substantially made of silicon nitride. It is, however, noted that it can also be made of other dielectric materials.

Figure 1B:
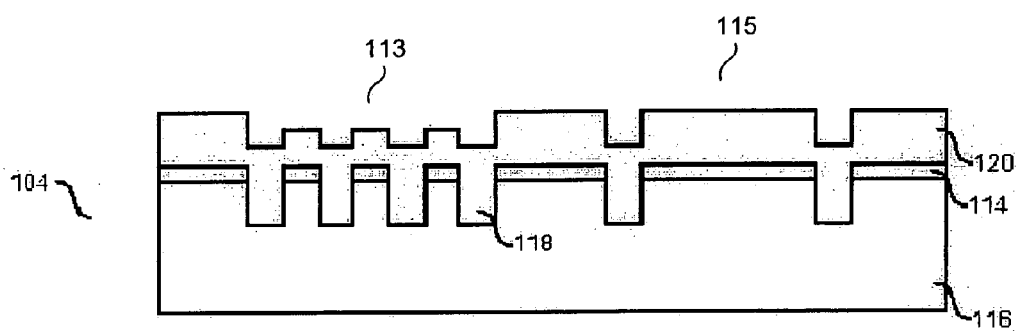

The portions of the semiconductor substrate 116 under the openings 117 of the first dielectric layer 114 are etched off, thereby forming one or more trenches 118 in the semiconductor substrate 116, as shown in FIG. 1B. The first area 113 of the semiconductor substrate 116 has a higher pattern (trench) density than that of the second area 115. A second dielectric layer 120 is deposited into the trenches 118 and on the second dielectric layer 114. The second dielectric layer 120 is thick enough to completely fill the trenches 118. With the second dielectric layer 120 deposited, an uneven surface is created over the semiconductor substrate 118, since the portion of the second dielectric layer 120 above the first dielectric layer 114 is higher than the portion of the second dielectric layer 120 above the trenches 118. In particular, the average height of the second dielectric layer 120 in the first area 113 is lower than that of the second dielectric layer 120 in the second area 115.

In this embodiment, the second dielectric layer 120 is substantially made of silicon oxide. It is, however, understood that the second dielectric layer 120 can also be made of other materials. The average height of the second dielectric layer 120 varies from the high pattern density area to the low pattern density area. In this embodiment, the average height of the second dielectric layer 120 in the first area 113 is no more than about 2,600 angstroms, and the average height of the second dielectric layer 120 in the second area 115 is no more than about 5,500 angstroms.

Figure 1C:
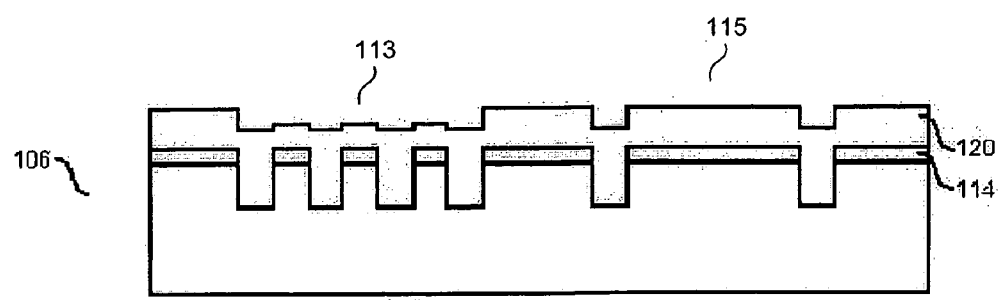

A regular CMP process, without using HSS, will then be performed on the second dielectric layer 120 to reduce its thickness (height). The cross-sectional view 106 of the semiconductor structure after the regular CMP process is illustrated in FIG. 1C. Since a CMP process using HSS can provide a higher polish rate for the second dielectric layer 120 than the regular CMP process, HSS is used for further polishing the second dielectric layer 120. The HSS can be a number of predetermined types of slurry. In this embodiment wherein the second dielectric layer 120 is substantially made of silicon oxide, the predetermined type of slurry can include any inorganic or organic surfactant. Specifically, the predetermined type of slurry can be, for example, substantially composed of ceria oxide abrasive surfactant.

Figure 2:
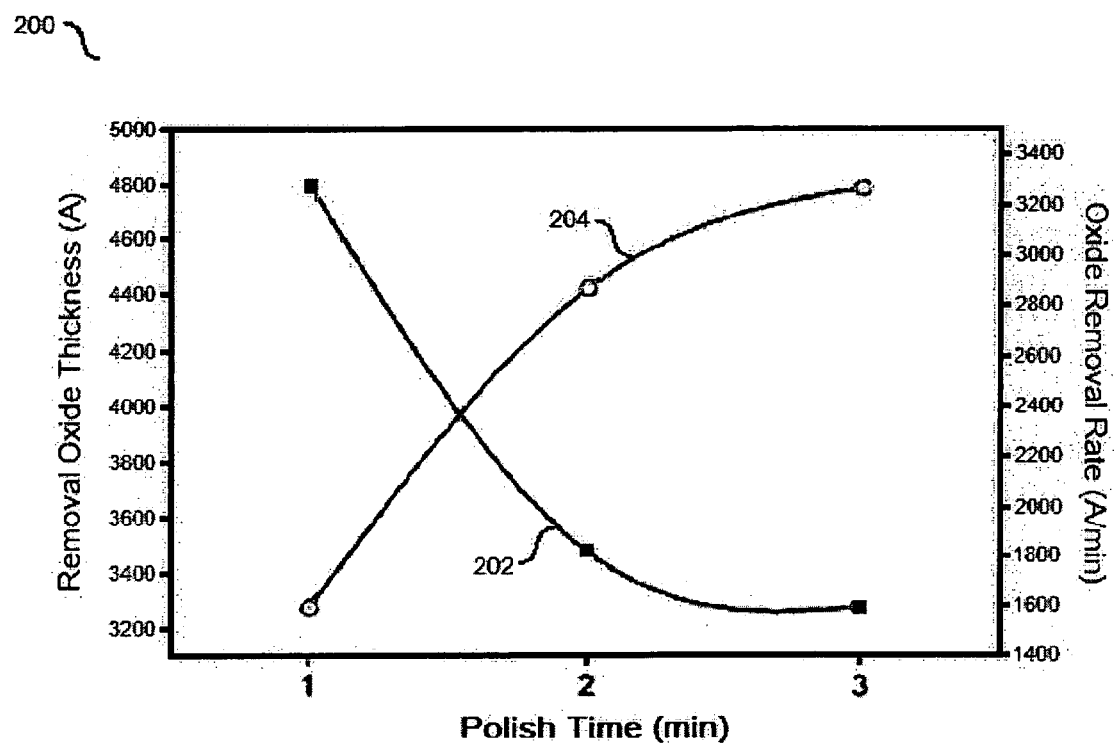
FIG. 2 illustrates a graph showing the polish rate and removal thickness of a silicon oxide layer during a CMP process using HSS.
Figure 3:
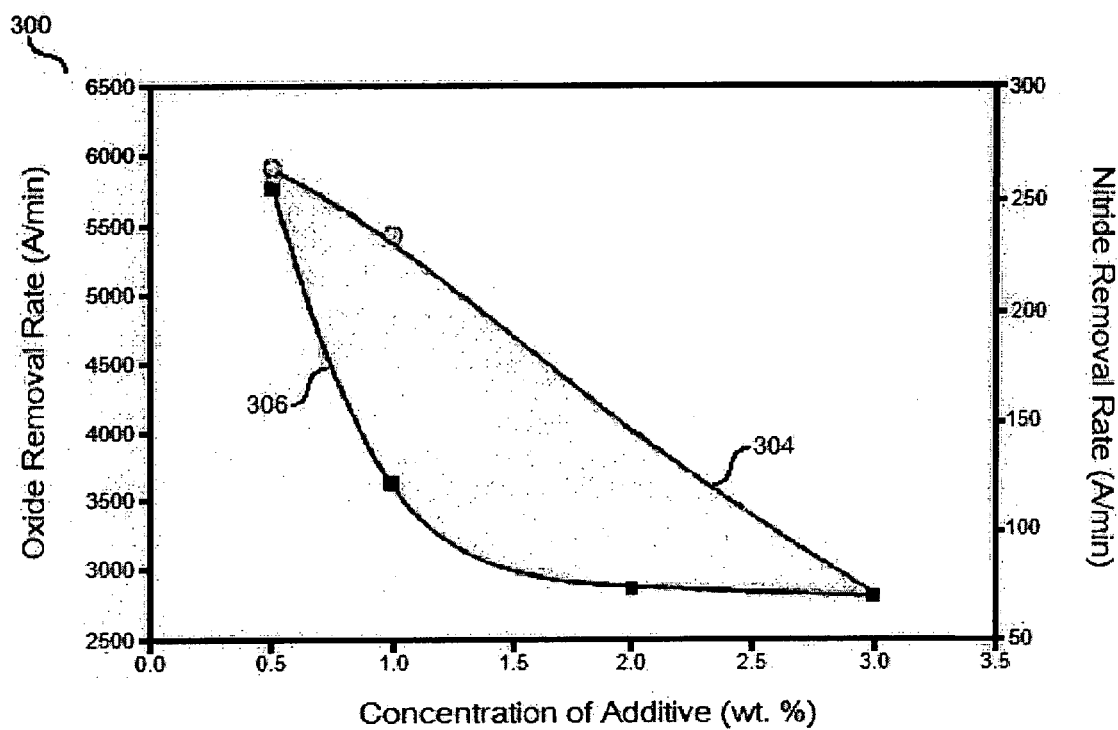
FIG. 3 illustrates a graph showing the polish rates of silicon oxide and silicon nitride when the additive concentration in the HSS changes during the CMP process.

The polish rate of the CMP process depends on the concentration of the additive that was produced during the process. FIG. 2 illustrates a graph 200 showing a set of oxide removal characteristics of the HSS. A curve 202 represents the oxide removal rate of the HSS. The oxide removal rate of HSS will slow down as the amount of oxide that is removed increases. The thickness of the oxide removed is represented by a curve 204. FIG. 3 illustrates a graph 300 showing the removal rates of silicon oxide and silicon nitride when the additive concentrations in the HSS change. The removal rate of the silicon oxide is represented by a curve 304 while the removal rate of the silicon nitride is represented by a curve 306. The removal rate of the silicon nitride drops dramatically at first and then levels off when the additive concentration is increased, while the removal rate of the oxide drops in a steady decline as the additive concentration increases.

Figure 1D:
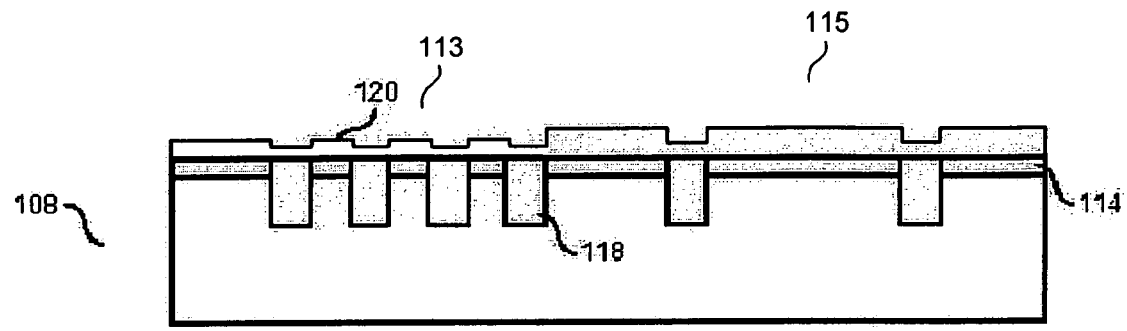

Referring back to FIG. 1C, as the CMP process continues, the additive concentration in the HSS changes in different rates in the first area 113 than in the second area 115, due to their different pattern densities. At one point, the second dielectric layer 120 needs to be rinsed for refreshing the polish rate for the second dielectric layer 120 in both the first and second areas 113 and 115. There are various ways of controlling the timing of the rinse step. For example, the resins step can be introduced after the HSS CMP has been performed for a predetermined period of time. As another example, the properties of the HSS can be detected for determining when to rinse the second dielectric layer 120. In this embodiment, the rinse step is performed when the second dielectric layer 120 reaches a predetermined thickness. As shown in FIG. 1D, deionized water is used to rinse the second dielectric layer 120 when its thickness in the second area 115 is no greater than about 1,500 angstroms and its thickness in the first area 113 is no greater than about 50 angstroms.

Figure 1E:
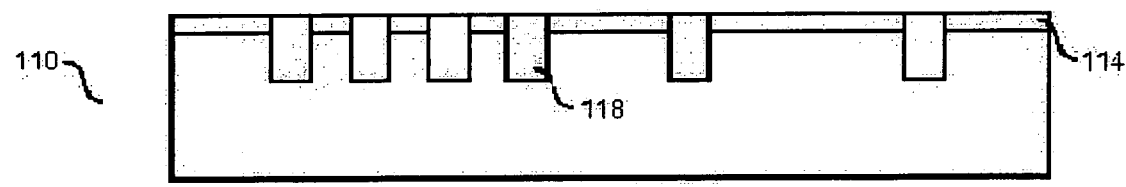
Figure 1F:
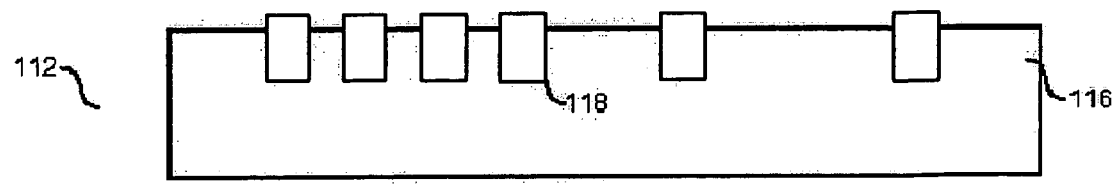

After the second dielectric layer 120 is rinsed with deionized water, the CMP process using the predetermined HSS is resumed to remove the portions of the second dielectric layer 120 outside the trenches 118, thereby producing a semiconductor structure as shown in the cross-sectional view 110 in FIG. 1E. It is noted that there may be still some second dielectric 120 remaining on the first dielectric layer 114, even though it is not shown in the figure for purposes of clarity. The first dielectric layer 114 is then removed by processes, such as CMP or etching-back, to produce a semiconductor structure with one or more STI structures represented by the filled trenches, as shown in the cross-sectional view 112 in FIG. 1F The proposed planarization method reduces the step height variation across a high pattern density area and a low pattern density area. The table below shows test results comparing the step height variation of a semiconductor structure formed by the conventional, continuous HSS CMP process to that of the structure formed by this two-step HSS CMP process proposed in this invention. According to the table, the step height variation between surfaces of the first and second areas is no more than 70 angstroms.

TABLE

| Slurry/ Polish Step | High Pattern Density Area | | Low Pattern Density Area | | Step Height Variation | |
| --- | --- | --- | --- | --- | --- | --- |
| | Center | Edge | Center | Edge | Center | Edge |
| HSS with 2 Steps | 558 A | 602 A | 490 A | 542 A | 68 A | 60 A |
| HSS with 1 Step | 611 A | 621 A | 489 A | 512 A | 122 A | 108 A |

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for planarizing a semiconductor structure, comprising:

providing a semiconductor substrate having a first area in which one or more trenches are formed in a first pattern density, and a second area in which one or more trenches are formed in a second pattern density lower than the first pattern density;

forming a first dielectric layer and a second dielectric layer, the second dielectric layer covering the trenches in the first and second areas and the first dielectric layer;

performing a first chemical mechanical polishing on the second dielectric layer using a predetermined type of slurry for reducing a thickness thereof;

rinsing the polished second dielectric layer by using deionized water; and performing a second chemical mechanical polishing on the second dielectric layer using the predetermined type of slurry for removing the second dielectric layer outside the trenches, thereby reducing a step height variation between surfaces of the first and second areas, and wherein the predetermined type of slurry provides a higher polish rate for the second dielectric layer than the first dielectric layer.

2. The method of claim 1 wherein the step height variation is no more than 70 angstroms.

3. The method of claim 1 wherein the first dielectric layer is made substantially of silicon nitride.

4. The method of claim 1 wherein the second dielectric layer is made substantially of silicon oxide.

5. The method of claim 1 wherein the predetermined type of slurry comprises ceria oxide abrasive surfactant.

6. The method of claim 1 wherein after the step of performing the first chemical mechanical polishing, the thickness of the second dielectric layer is no greater than about 1,500 angstroms in the second area.

7. The method of claim 6 wherein after the step of performing the first chemical mechanical polishing, the thickness of the second dielectric layer is no greater than about 50 angstroms in the first area.

8. A method for forming one or more isolation structures on a semiconductor substrate, comprising:

forming a first dielectric layer having one or more openings on the semiconductor substrate;

etching the semiconductor substrate through the openings to form one or more trenches in a first pattern density in a first area of the semiconductor substrate, and one or more trenches in a second pattern density in a second area of the semiconductor substrate, wherein the second pattern density is lower than the first pattern density;

forming a second dielectric layer on the first dielectric layer, and covering the trenches in the first and second areas;

performing a first chemical mechanical polishing on the second dielectric layer using a predetermined type of slurry for reducing a thickness thereof;

rinsing the second dielectric layer using deionized water; and performing a second chemical mechanical polishing on the second dielectric layer using the predetermined type of slurry for further removing the second dielectric layer outside the trenches, thereby reducing a step height variation between surfaces of the first and second areas, and wherein the predetermined type of slurry provides a higher polish rate for the second dielectric layer than the first dielectric layer.

9. The method of claim 8 wherein the step height variation is no more than 70 angstroms.

10. The method of claim 9 wherein the first dielectric layer is made substantially of silicon nitride.

11. The method of claim 10 wherein the second dielectric layer is made substantially of silicon oxide.

12. The method of claim 8 wherein the predetermined type of slurry comprises ceria oxide abrasive surfactant.

13. The method of claim 8 wherein after the step of performing the first chemical mechanical polishing, the thickness of the second dielectric layer is no greater than about 1,500 angstroms in the second area.

14. The method of claim 13 wherein after the step of performing the first chemical mechanical polishing the thickness of the second dielectric layer is no greater than about 50 angstroms in the first area.

15. A method for forming one or more isolation structures on a semiconductor substrate, comprising:

forming a silicon nitride layer having one or more openings on the semiconductor substrate;

etching the semiconductor substrate through the openings to form one or more trenches in a first pattern density in a first area of the semiconductor substrate, and one or more trenches in a second pattern density in a second area of the semiconductor substrate wherein the second pattern density is lower than the first pattern density;

forming a silicon oxide layer on the silicon nitride layer, and covering the trenches in the first and second areas;

performing a first chemical mechanical polishing on the silicon oxide layer using a predetermined type of slurry providing a higher polish rate for the silicon oxide layer than the silicon nitride layer for reducing a thickness of the silicon oxide layer;

rinsing; the silicon oxide layer using deionized water; and performing a second chemical mechanical polishing on the silicon oxide layer using the predetermined type of slurry for removing the silicon oxide layer outside the trenches, thereby reducing a step height variation between surfaces of the first and second areas.

16. The method of claim 15 wherein the predetermined type of slurry comprises ceria oxide abrasive surfactant.

17. The method of claim 15 wherein after the step of performing the first chemical mechanical polishing, the thickness of the second dielectric layer is no greater than about 1,500 angstroms in the second area.

18. The method of claim 17 wherein after the step of performing the first chemical mechanical polishing, the thickness of the second dielectric layer is no greater than about 50 angstroms in the first area.

19. A method for planarizing a semiconductor structure, comprising:

providing a semiconductor substrate having a first area in which one or more trenches are formed in a first pattern density, and a second area in which one or more trenches are formed in a second pattern density lower than the first pattern density;

forming a first dielectric layer comprising silicon nitride and a second dielectric layer, the second dielectric layer covering the trenches in the first and second areas and the first dielectric layer;

performing a first chemical mechanical polishing on the second dielectric layer using a predetermined type of slurry for reducing a thickness thereof;

rinsing the polished second dielectric layer by using deionized water; and performing a second chemical mechanical polishing on the second dielectric layer using the predetermined type of slurry for removing the second dielectric layer outside the trenches, thereby reducing a step height variation between surfaces of the first and second areas, and wherein the predetermined type of slurry provides a higher polish rate for the second dielectric layer than the first dielectric layer.

20. The method of claim 19 wherein the step height variation is no more than 70 angstroms.

21. The method of claim 19 wherein the second dielectric layer is made substantially of silicon oxide.

* * * * *